United States Patent
Oh et al.

(10) Patent No.: US 8,105,904 B2
(45) Date of Patent: Jan. 31, 2012

(54) METHOD OF MANUFACTURING SEMICONDUCTOR DEVICES

(75) Inventors: Yong-Chul Oh, Suwon-si (KR); Kang-Uk Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 167 days.

(21) Appl. No.: 12/704,233

(22) Filed: Feb. 11, 2010

(65) Prior Publication Data
US 2010/0203695 A1    Aug. 12, 2010

(30) Foreign Application Priority Data
Feb. 12, 2009    (KR) .................. 10-2009-0011525

(51) Int. Cl.
*H01L 21/336* (2006.01)

(52) U.S. Cl. .................. 438/270; 257/E21.676
(58) Field of Classification Search ........... 438/268–274
See application file for complete search history.

(56) References Cited

U.S. PATENT DOCUMENTS
7,951,667 B2 *   5/2011   Kim ........................ 438/253

FOREIGN PATENT DOCUMENTS
| JP | 08-064778 | 3/1996 |
| JP | 2003-110096 | 4/2003 |
| KR | 1020070047069 | 5/2007 |

* cited by examiner

*Primary Examiner* — Charles Garber
*Assistant Examiner* — Calvin Choi
(74) *Attorney, Agent, or Firm* — F. Chau & Associates, LLC

(57) ABSTRACT

A semiconductor device includes an insulation layer disposed on a substrate having a first area and a second area, a first wiring disposed on the insulation layer in the first area, a first active structure disposed on the first wiring, a first gate insulation layer enclosing the first upper portion, a first gate electrode disposed on the first gate insulation layer, a first impurity region disposed at the first lower portion, and a second impurity region disposed at the first upper portion. The first wiring may extend in a first direction. The first active structure includes a first lower portion extending in the first direction and a first upper portion protruding from the first lower portion. The first gate electrode may extend in a second direction. The first impurity region may be electrically connected to the first wiring.

11 Claims, 10 Drawing Sheets

METHOD OF MANUFACTURING SEMICONDUCTOR DEVICES

CROSS-REFERENCE TO RELATED APPLICATIONS

This application claims priority under 35 U.S.C. §119 to Korean patent Application No. 10-2009-0011525 filed on Feb. 12, 2009, the disclosure of which is hereby incorporated by reference herein in its entirety.

BACKGROUND

1. Technical Field

The present disclosure relates to a semiconductor device and to a method of manufacturing a semiconductor device. More particularly, the present disclosure relates to a semiconductor device including a transistor having a vertical channel region and a transistor having a horizontal channel region, and to a method of manufacturing the semiconductor device including transistors having channel regions generated different directions.

2. Description of the Related Art

In a conventional semiconductor memory device, a transistor may include a source region, a drain region and a gate electrode. Charges such as electrons or holes may generate from the source region and may flow into the drain region. The gate electrode may control the flow of the charges between the source region and the drain region. A channel region may be generated at a portion of a semiconductor substrate located between the source and the drain regions. To electrically insulate the channel region from the gate electrode, a gate insulation layer may be disposed between the gate electrode and the substrate.

As for the conventional transistor, a gate structure typically includes a gate insulation layer and a gate electrode sequentially stacked on a substrate. Source/drain regions of the transistors are located at portions of the substrate adjacent to the gate structure. Thus, a channel region of the transistor is horizontally formed at a portion of the substrate between the source/drain regions.

As a current semiconductor memory device has a high integration degree, a gate electrode of a transistor in the semiconductor device may have a considerably reduced length, so that a short channel effect may occur in the transistor having the gate electrode of a minute length. When the short channel effect generates in the transistor, the transistor may encounter various difficulties, such as for example, an increase of a leakage current, a decrease of a thresh hole voltage, a continuous increase of a drain induced current, etc. Meanwhile, the transistor has been used to provide a design rule below a critical dimension of a photolithography process as the semiconductor memory device has been an integration degree above giga bites. Hence, the conventional transistor having a vertical channel region between source/drain regions may not be properly employed in the highly integrated semiconductor memory device.

To improve the integration degree of the semiconductor memory device, there is provided a transistor having a structure wherein a source region and a drain region arranged along a vertical direction relative to a substrate. Such a transistor has a channel region vertically formed between the source and the drain regions. In the transistor having the vertical channel region, an active region of the transistor may be protruded from the substrate. The source region and the drain region may be formed at an upper portion and a lower portion of the active region.

The channel region of the transistor may be generated at a portion of the active region along a direction perpendicular with respect to the substrate. A word line of the transistor may enclose the active region in a horizontal direction relative to the substrate, and a bit line of the transistor may be disposed below the word line. The bit line may be formed by doping impurities into portions of the active region, such that the bit line may have a resistance substantially larger than that of a bit line in the convention transistor. However, when the bit line has an increased resistance, a signal may not be sufficiently applied to the transistor, thereby possibly deteriorating electrical characteristics of the semiconductor device having the transistor.

In the meantime, a semiconductor memory device generally includes a memory cell area and a logic area. A vertical channel transistor may be disposed in the memory cell area whereas a planar channel transistor may be provided in the logic area. The planar transistor in the logic area may be a P type metal oxide semiconductor (PMOS) transistor or an N type MOS (NMOS) transistor. As the semiconductor memory device may need a very high integration degree, the planar channel transistor should have a high integration degree. However, a p-n junction between adjacent planar channel transistors and/or the planar transistor and the vertical channel transistor may be frequently caused by migration of impurities, so that the electrical characteristics semiconductor memory device may be deteriorated.

Thus, there is still a need in the art for a semiconductor device which includes a bit line which has significantly reduced resistance in a cell area of the semiconductor device in comparison with that of the conventional semiconductor device and also wherein a p-n junction between the cell area and the logic area of the semiconductor device is prevented.

SUMMARY

Example embodiments may provide a semiconductor device including transistors having channel regions generated along different directions relative to a substrate.

Example embodiments may provide a method of manufacturing a semiconductor device including transistors having channel regions respectively formed in different directions with respect to a substrate.

In accordance with an example embodiment, a semiconductor device is provided. The semiconductor device includes an insulation layer, a first wiring, a first active structure, a first gate insulation layer, a first gate electrode, a first impurity region and a second impurity region. The insulation layer is disposed on a substrate that includes a first area and a second area. The first wiring is disposed on the insulation layer in the first area. The first wiring may extend in a first direction. The first active structure is disposed on the first wiring. The first active structure includes a first lower portion and a first upper portion. The first lower portion may extend in the first direction and the first upper portion may protrude from the first lower portion. The first gate insulation layer may enclose the first upper portion. The first gate electrode is disposed on the first gate insulation layer. The first gate electrode may extend in a second direction. The first impurity region is disposed at the first lower portion. The first impurity region may be electrically connected to the first wiring. The second impurity region is disposed at the first upper portion.

In example embodiments, the first wiring may include titanium, tantalum, titanium nitride, tantalum nitride, etc. These may be used along or in a mixture thereof.

In example embodiments, the first active structure may include a material substantially the same as a material of the substrate.

In example embodiments, the semiconductor device may further include a first field isolation layer pattern, an insulating interlayer, a first contact and a second contact. The first field isolation layer pattern may be disposed in the first area to isolate adjacent first active structures. The first field isolation layer pattern may have a height substantially larger than that a height of the first lower portion. The insulating interlayer may cover the first field isolation layer pattern, the first gate electrode and the first active structure. The first contact may be electrically connected to the first gate electrode through the insulating interlayer. The second contact may be electrically connected to the first impurity region and the first wiring through the insulating interlayer and the first field isolation layer pattern.

In example embodiments, the semiconductor device may further include a second wiring, a second active structure, a second gate insulation layer, a second gate electrode, a third impurity region and a fourth impurity region. The second wiring may be disposed on the insulation layer in the second area. The second active structure may be disposed on the second wiring. The second active structure may include a second lower portion and a second upper portion. The second lower portion may extend in the second direction and the second upper portion may protrude from the second upper portion. The second gate insulation layer may be disposed on the second upper portion. The second gate electrode may be disposed on the second gate insulation layer. The third impurity region and the fourth impurity region may be disposed at the second upper portion adjacent to the second gate electrode.

In example embodiments, the second lower portion may have a width substantially larger than a width of the first lower pattern. The second upper pattern may have a width substantially larger than a width of the first upper pattern.

In example embodiments, the semiconductor device may additionally include a second field isolation layer pattern and third contacts. The second field isolation layer pattern may be disposed in the second area to isolate adjacent second active structures. The second field isolation layer may expose the second upper portion. The third contacts may be electrically connected to the third impurity region and the fourth impurity region.

In example embodiments, the insulating interlayer may cover the second field isolation layer pattern, the second gate electrode and the second active structure. The second field isolation layer pattern may have a height substantially larger than a height of the first field isolation layer pattern.

In accordance with another example embodiment, a method of manufacturing a semiconductor device is provided. In the method of manufacturing a semiconductor device, an insulation layer is formed on a substrate having a first area and a second area. A conductive layer is formed on the insulation layer. A semiconductor layer is formed on the conductive layer. A first active structure is formed on the conductive layer in the first area by etching the semiconductor layer. The first active structure includes a first lower portion extending in a first direction and a first upper portion protruding from the first lower portion. A first wiring is formed beneath the first active structure by etching the conductive layer. The first wiring extends in the first direction. A first gate insulation layer is formed to enclose the first upper portion. A first impurity region is formed at the first lower portion to extend in the first direction. The first impurity region is electrically connected to the first wiring. A second impurity region is formed at the first upper portion.

In forming the first active structure according to example embodiments, a first mask may be formed on the semiconductor layer in the first area. The first upper portion may be formed by partially etching the semiconductor layer using the first mask. A second mask may be formed on a sidewall of the first upper portion. The second mask may extend in the first direction. The first lower portion may be formed by partially etching the semiconductor layer using the second mask.

In example embodiments, the first wiring may be formed by etching the conductive layer using the second mask as an etching mask.

In example embodiments, after removing the second mask, a first field isolation layer pattern may be formed on the insulation layer in the first area. The first field isolation layer pattern may cover the first active structure and have a height substantially larger than the first lower portion. Further, an insulating interlayer may be formed to cover the first gate electrode, the first active structure and the first field isolation layer pattern. A first contact may be formed to be electrically connected to the first gate electrode through the insulating interlayer. A second contact may be formed to be electrically connected to the first impurity region and the first wiring through the insulating interlayer and the first field isolation layer pattern.

In example embodiments, a preliminary first impurity region may be formed at the semiconductor layer adjacent to the first upper portion after forming the first upper portion. The first impurity region may be formed by partially etching the preliminary first impurity region while forming the first lower portion.

In example embodiments, a second active structure may be formed on the conductive layer in the second area by etching the semiconductor layer. A second wiring may be formed beneath the second active structure by partially etching the conductive layer.

In forming the second active structure according to example embodiments, a third mask may be formed on the semiconductor layer in the second area. A second upper portion may be formed by etching the semiconductor layer using the third mark. The second upper portion may extend in the first direction. A fourth mask may be formed on a sidewall of the second upper portion. A second lower portion may be formed by partially etching the semiconductor layer using the fourth mask. The second lower portion may extend in the first direction. A second field isolation layer pattern may be formed in the second area to cover the second active structure and to expose the second upper portion. A second gate insulation layer may be formed on the second upper portion. A second gate electrode may be formed on the second gate insulation layer. A third impurity region and a fourth impurity region may be formed at the second upper portion adjacent to the second gate electrode.

According to example embodiments, the first impurity region may be electrically connected to the first wiring serving as a bit line in the semiconductor device that includes a first transistor having a channel region generated in a direction substantially perpendicular to the substrate. Thus, the bit line may have significantly reduced resistance in a cell area of the semiconductor device. Further, adjacent first and second active structures may be certainly separated by the first and the second field isolation layer patterns, so that p-n junction between the cell area and a logic area may be effectively prevented. As a result, the semiconductor device may provide enhanced electrical characteristics.

BRIEF DESCRIPTION OF THE DRAWINGS

Example embodiments can be understood in more detail from the following description taken in conjunction with the accompanying drawings, in which.

DESCRIPTION OF EXAMPLE EMBODIMENTS

Figure 1:
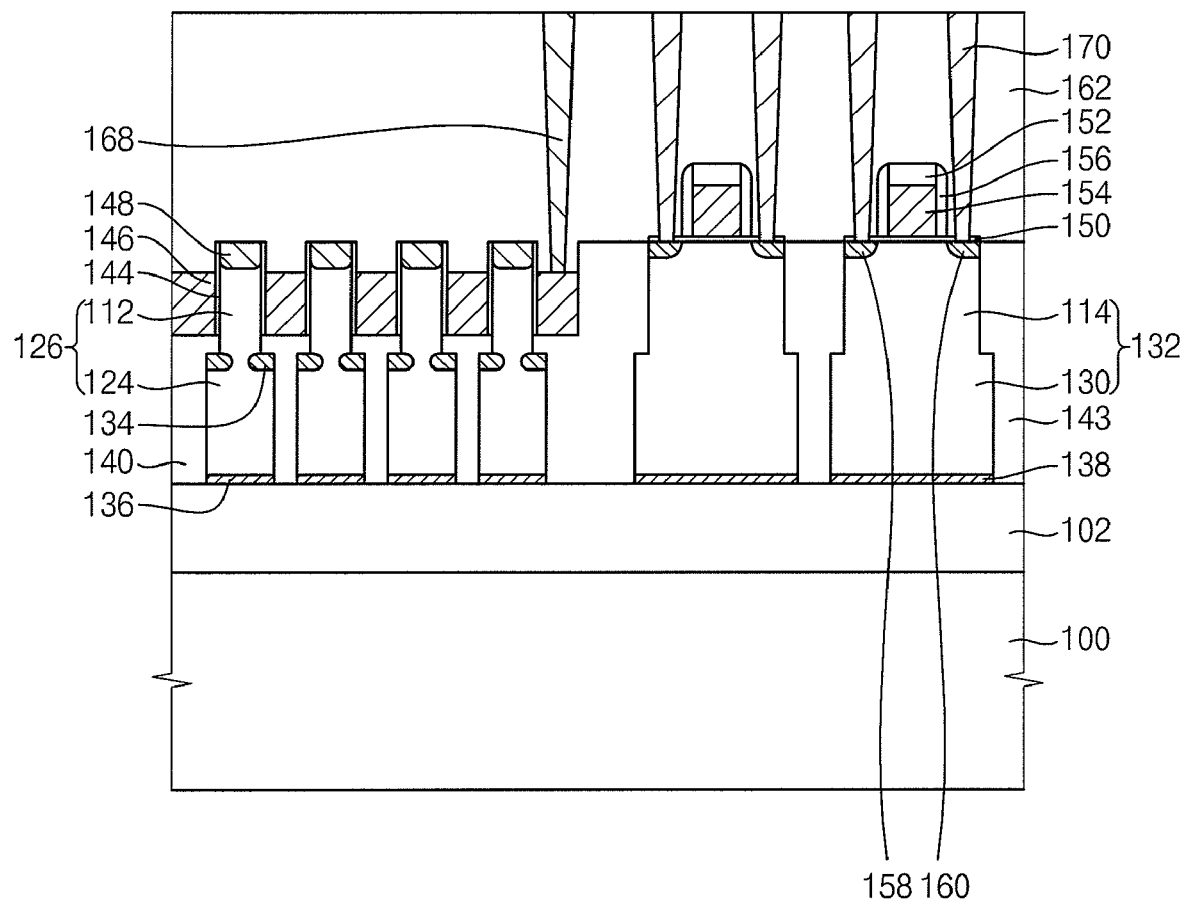
FIGS. 1 and 2 are cross sectional views illustrating semiconductor devices having transistors in accordance with an example embodiment.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the related art and will not be interpreted in an idealized or overly formal sense unless expressly so defined herein.

Figure 2:
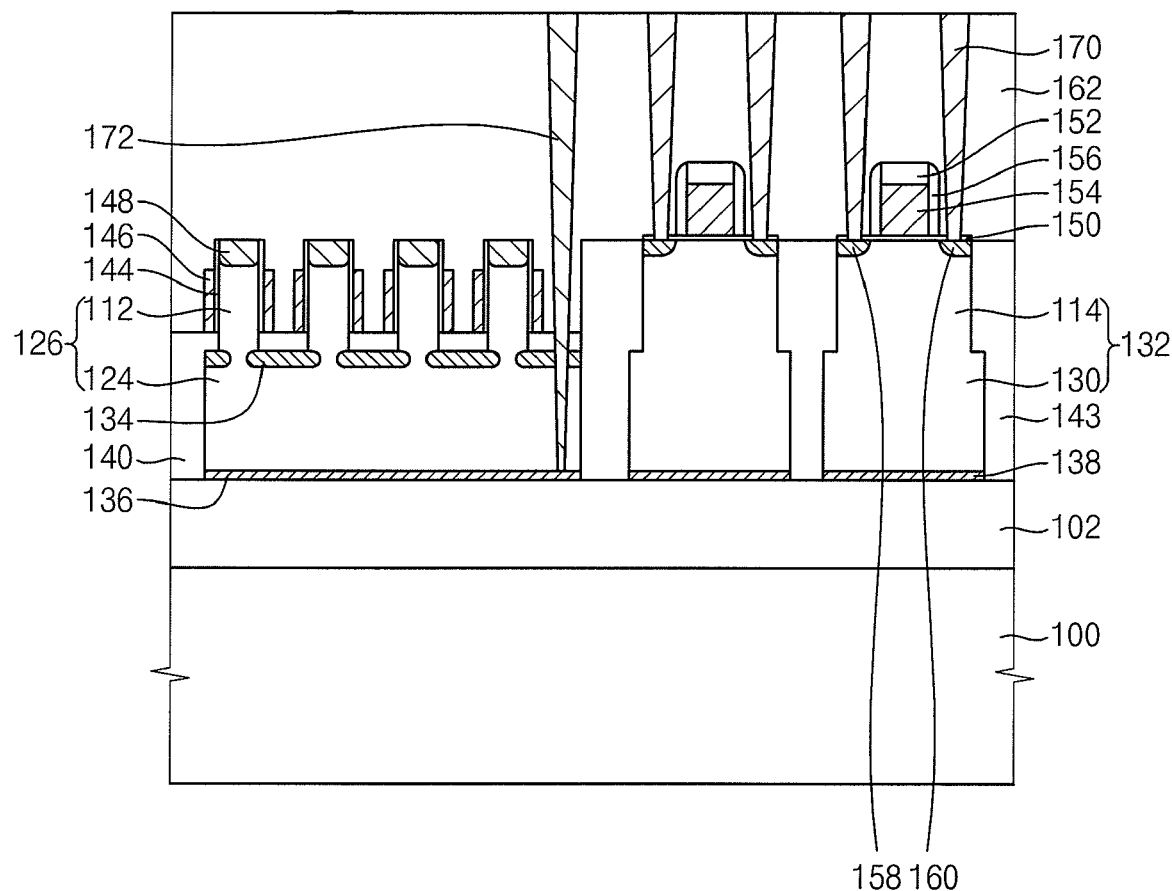

FIGS. 1 and 2 are cross sectional views illustrating semiconductor devices including different transistors in accordance with example embodiments. The semiconductor device illustrated in FIGS. 1 and 2 may includes a plurality of first transistors and a plurality of second transistors. In example embodiments, the first transistor may have a first channel provided in a first direction substantially perpendicular to a substrate whereas the second transistor may have a second channel generated along a second direction substantially perpendicular to the first direction. That is, the second channel may be disposed in a substantially horizontal direction with respect to the substrate. The first transistor and the second transistor may be located in a first area and a second area of the substrate, respectively. The first area may correspond to a memory cell area and the second area may correspond to a peripheral circuit area.

Referring to FIGS. 1 and 2, the semiconductor device includes a substrate 100, an insulation layer 102, a first wiring 136, a second wiring 138, a first active structure 126 and a second active structure 132. The first and the second transistors may be disposed on the first and the second active structures 126 and 132, respectively. When the semiconductor device includes the plurality of the first and the second transistors, a plurality of first active structures 126 and a plurality of second active structures 132 may be provided on the substrate 100.

The substrate 100 may include a semiconductor substrate, for example, a silicon (Si) substrate, a germanium (Ge) substrate, a silicon-germanium (Si—Ge) substrate, etc. Alternatively, the substrate 100 may include a substrate having a semiconductor layer such as, for example, a silicon-on-insulator (SOI) substrate, a germanium-on-insulator (GOI) substrate, etc.

The insulation layer 102 may include an oxide such as, for example, silicon oxide. Alternatively, the insulation layer 102 may include, for example, an oxynitride or a nitride. For example, the insulation layer 102 may include silicon nitride, silicon oxynitride, etc. When the substrate 100 includes the first area and the second area, the insulation layer 102 may be located on a whole surface of the substrate 100. In example embodiments, the insulation layer 102 may prevent charges such as electrons or holes from moving between adjacent conductive structures.

The first wiring 136 is positioned on a first portion of the insulation layer 102 in the first area of the substrate 100. The first wiring 136 may extend on the insulation layer 102 along a first direction. The first wiring 136 may include a metal and/or a metal nitride having a relatively high melting point to prevent electrical characteristics thereof from being deteriorated in successive processes. For example, the first wiring 136 may include titanium (Ti), titanium nitride (TiNx), tantalum (Ta), tantalum nitride (TaNx), tungsten (W), tungsten nitride (WNx), etc. These may be used alone or in a mixture thereof.

The first active structure 126 is located on the first wiring 136 in the first area of the substrate 100. The first active structure 126 includes a first upper portion 112 and a first lower portion 124. The first active structure 126 may include a material substantially the same as or substantially similar to that of the substrate 100. For example, the first active structure may include a semiconductor material such as silicon, germanium, silicon-germanium or the like.

The first lower portion 124 of the first active structure 126 is disposed on the first wiring 136. The first lower portion 124 may have, for example, a circular pillar shape, a polygonal pillar shape, an elliptical pillar shapes, etc. The first lower portion 124 may have a first width. In example embodiments, the first width of the first lower portion 124 may be substantially the same as or substantially similar to that of the first wiring 136. Further, the first lower portion 124 may extend on the first wiring 136 in a direction substantially in parallel relative to the first wiring 136. For example, the first lower portion 124 of the first active structure 126 may be prolonged along the first direction.

The first upper portion 112 is positioned on the first lower portion 126. The first upper portion 112 may be protruded from the first lower portion 126 in a direction substantially perpendicular to the substrate 100. The first upper portion 112 may also have, for example, a circular pillar shape, a polygonal pillar shape, an elliptical pillar shapes, etc. The first upper portion 112 and the first lower portion 124 may be integrally formed with each other. The first upper portion 112 may have a second width substantially smaller than the first width of the first lower portion 124. Thus, a step may be generated between the first lower portion 124 and the first upper portion 112. In some example embodiments, more than two first upper portions 112 may be provided on one first lower portion 124.

Adjacent first active structures 126 are electrically separated from each other by a first isolation layer pattern 140 formed in the first area of the substrate 100. The first field isolation layer pattern 140 may partially cover the first active structure 126. For example, the first isolation layer pattern 140 may fully cover the first lower portion 124 and may partially cover the first upper portion 112. Hence, the first isolation layer pattern 140 may have a height substantially larger than a height of the first lower portion 124 whereas the height of the first field isolation layer pattern 124 may be substantially smaller than a height of the first active structure 126.

The first field isolation layer pattern 140 may include an oxide such as, for example, silicon oxide. For example, the first field isolation layer pattern 140 may include undoped silicate glass (USG), spin on glass (SOG), phosphor silicate glass (PSG), boro-phosphor silicate glass (BPSG), flowable oxide (FOX), tetraethyl ortho silicate (TEOS), plasma enhanced-TEOS (PE-TEOS), fluorosilicate glass (FSG), Tonen silazene (TOSZ), high density plasma-chemical vapor deposition (HDP-CVD) oxide, etc.

The first transistor is disposed on the first active structure 126. The first transistor includes a first gate insulation layer 144, a first gate electrode 146, a first impurity region 134 and a second impurity region 148. The first and the second impurity regions 134 and 148 may correspond to a source region and a drain region. Accordingly, the first transistor may have a channel region generated at the first upper portion 112 along a direction substantially perpendicular to the substrate 100. In other words, the first transistor may have a channel formed vertically with respect to the substrate 100.

The first gate insulation layer 144 is positioned on the first upper portion 112 of the first active structure 126. For example, the first gate insulation layer 144 may enclose the first upper portion 112 protruded from the first field isolation layer pattern 140. Thus, the first gate insulation layer 144 may not make contact with the first impurity region 134. Alternatively, the first gate insulation layer 144 may contact the first impurity region 134 when the first gate insulation layer 144 fully enclose the first upper portion 112 of the first active structure 126.

The first gate insulation layer 144 may include, for example, an oxide or a metal oxide. For example, the first gate insulation layer 144 may include silicon oxide, hafnium oxide (HfOx), aluminum oxide (AlOx), zirconium oxide (ZrOx), tantalum oxide (TaOx), etc.

The first gate electrode 146 is located on the first field isolation layer pattern 140 between adjacent first active structures 126. The first gate electrode 146 may enclose the first upper portion 112 on which the first gate insulation layer 144 is formed. That is, the first gate insulation layer 144 may be interposed between the first upper portion 112 and the first gate electrode 146. The first gate electrode 146 may extend on the first field isolation layer pattern 140 along a second direction different from the first direction in which the first wiring 136 may extend. For example, the second direction may be substantially perpendicular to the first direction. The first gate electrode 146 may serve as a word line in the semiconductor device.

The first gate electrode 146 may include, for example, polysilicon, a metal and/or a metal compound. For example, the first gate electrode 146 may include polysilicon doped with impurities, tungsten, titanium, aluminum (Al), tantalum, tungsten nitride, aluminum nitride (AlNx), titanium nitride, titanium aluminum nitride (TiAlxNy), tantalum nitride, tungsten silicide (WSix), titanium silicide (TiSix), cobalt silicide (CoSix), nickel silicide (NiSix), etc. These may be used alone or in a mixture thereof.

The first gate electrode 146 may have, for example, a single layer structure that includes a polysilicon film, a metal film or a metal compound film. Alternatively, the first gate electrode 146 may have, for example, a multi layer structure which includes at least one polysilicon film, at least one metal film and/or at least one metal compound film.

In example embodiments, the first gate electrode 146 may have a height substantially smaller than a height of the first active structure 126. For example, the first upper portion 112 of the first active structure 126 may be partially protruded from the first gate electrode 146. Here, the second impurity region 148 may be formed at a portion of the first upper portion 122 exposed from the first gate electrode 146.

The first impurity region 134 may serve as one of the source/drain region of the first transistor. The first impurity region 134 may be located at an upper surface of the first lower portion 124 in the first active structure 126. Namely, the first impurity region 134 may be positioned at the step between the first lower portion 124 and the first upper portion 112. The first impurity region 134 may enclose the upper surface of the first lower portion 124 connected to the first upper portion 112.

In example embodiments, the first impurity region 134 may extend in a direction substantially parallel with respect to the first lower portion 124. For example, the first impurity region 134 may be prolonged along the first direction. The first impurity region 134 may be electrically connected to the first wiring 136 through a second contact 172 as illustrated in FIG. 2. The first wiring 136 may serve as a bit line of the semiconductor device, so that the semiconductor device having the first wiring 136 may provide improved electrical characteristics because the first wiring 136 has a lower resistance than that of the first impurity region 134.

The second impurity region 148 may serve as the other of the source/drain region of the first transistor. The second impurity region 148 may be formed at a portion of the first upper portion 112. For example, the second impurity region 148 may be provided at the portion of the first upper portion 112 exposed by the first field isolation layer pattern 140. The second impurity region 148 may include impurities substantially the same as or substantially similar to those in the first impurity region 134. The second impurity region 148 may be electrically connected to a capacitor formed over the first transistor.

The second transistor is disposed on the second active structure 132. The second transistor includes a second gate insulation layer 150, a second gate electrode 156, a gate mask 152, a gate spacer 156, a third impurity region 158 and a fourth impurity region 160. The third and the fourth impurity regions 158 and 160 may correspond to a source region and a drain region of the second transistor. Therefore, the second transistor may have a channel region formed at the second upper portion 114 along a direction substantially parallel relative to the substrate 100. That is, the second transistor may have a channel formed horizontally with respect to the substrate 100. In some example embodiments, the gate spacer 156 may be omitted to simplify the construction of the second transistor when desired.

The second active structure 132 is located on the second wiring 138 in the second area of the substrate 100. The second active structure 132 includes a second upper portion 114 and a second lower portion 130. The second active structure 132 may include a material substantially the same as or substantially similar to that in the substrate 100. For example, the second active structure 132 may include a semiconductor material such as silicon, germanium, silicon-germanium, etc. Further, the second active structure 132 may include the semiconductor material substantially the same as or substantially similar to that of the first active structure 126.

In example embodiments, the second wiring 138 may extend along a direction substantially in parallel relative to the first direction where the first wiring 136 extends. Further, the second wiring 138 may have a width substantially the same as or substantially similar to that of the first wiring 136.

The second lower portion 130 of the second active structure 132 is disposed on the second wiring 138 in the second area of the substrate 100. The second lower portion 130 may have a width substantially larger than a width of the first lower portion 124 of the first active structure 126. The second lower portion 130 of the second active structure 132 may extend along a direction substantially in parallel with respect to the first direction.

The second upper portion 114 is protruded from the second lower portion 130. The second upper portion 114 may have a width substantially smaller than that a width of the second lower portion 130. Hence, a step may be formed between the second lower portion 130 and the second upper portion 114. The second upper portion 114 of the second active structure 132 may also extend along the first direction.

In example embodiments, a well may be formed at the second active structure 132. For example, the well may be provided at the second upper portion 114. Here, the third and the fourth impurity regions 158 and 160 may be positioned in the well. When the well includes P type impurities, the third and the fourth impurity regions 158 and 160 may include P type impurities, so that the second transistor may correspond to an N type metal oxide semiconductor (NMOS) transistor. Meanwhile, the third and the fourth impurity regions 158 and 160 may include P type impurities when the well includes N type impurities. Here, the second transistor may correspond to a P type MOS (PMOS) transistor. The insulation layer 102 and the second wiring 138 are disposed beneath the second active structure 132, migration of impurities between the first and the second area may be prevented.

Adjacent second active structures 132 are isolated by the second isolation layer pattern 143 in the second area of the substrate 100. The second isolation layer pattern 143 may fully cover the second active structure 132 while exposing a surface of the second upper portion 114 of the second active structure 132. The third and the fourth impurity regions 158 and 160 may be provided at the exposed second upper portion 114. The second isolation layer pattern 143 may have a height substantially the same as or substantially similar to the whole height of the second active structure 132. However, the second isolation layer pattern 143 may have a height substantially smaller than a height of the second active structure 132.

The second field isolation layer pattern 143 may include an oxide such as, for example, silicon oxide. For example, the second field isolation layer pattern 143 may include USG, SOG, PSG, BPSG, FOX, TEOS, PE-TEOS, FSG, TOSZ, HDP-CVD oxide, etc. In example embodiments, the second field isolation layer pattern 143 may include an oxide substantially the same as or substantially similar to an oxide of the first field isolation layer pattern 140. Alternatively, the second field isolation layer pattern 143 may include an oxide different from that of the first field isolation layer pattern 140.

The second gate insulation layer 150 is positioned on the exposed second upper portion 114 of the second active structure 132. The second gate insulation layer 150 may include, for example, an oxide or a metal compound. For example, the second gate insulation layer 150 may include silicon oxide, hafnium oxide, titanium oxide, aluminum oxide, zirconium oxide, etc. These may be used alone or in a mixture thereof. In example embodiments, the second gate insulation layer 150 may include a material substantially the same as or substantially similar to a material of the first gate insulation layer 144. Alternatively, the first and the second gate insulation layers 144 and 150 may include different materials, respectively.

The second gate electrode 154 is disposed on the second gate insulation layer 150. The second gate electrode 154 may include, for example, polysilicon, a metal and/or a metal compound. For example, the second gate electrode 154 may include polysilicon doped with impurities, tungsten, titanium, aluminum, tantalum, tungsten nitride, aluminum nitride, titanium nitride, titanium aluminum nitride, tantalum nitride, tungsten silicide, titanium silicide, cobalt silicide, nickel silicide, etc. These may be used alone or in a mixture thereof. In example embodiments, the second gate electrode 154 may include a material substantially the same as or substantially similar to that of the first gate electrode 146. Alternatively, the first and the second gate electrodes 146 and 154 may include different materials, respectively.

In example embodiments, the second gate electrode 154 may also have, for example, a single layer structure that includes a polysilicon film, a metal film or a metal compound film. Alternatively, the second gate electrode 154 may have, for example, a multi layer structure which includes at least one polysilicon film, at least one metal film and/or at least one metal compound film. The second gate electrode 154 may extend on the second gate insulation layer 150 along a direction substantially in parallel relative to the first direction.

The gate mask 152 is provided on the second gate electrode 154. The gate mask 152 may include a material having an etching selectivity with respect to the second gate electrode 154 and the second gate insulation layer 150. For example, the gate mask 152 may include a nitride like silicon nitride or an oxynitride such as silicon oxynitride. The gate mask 152 may electrically insulate the second gate electrode 154 from, for example, a contact, a plug and/or an upper wiring of the semiconductor device.

The gate spacer 156 is positioned on sidewalls of the gate mask 152 and the second gate electrode 154. The gate spacer 156 may also include a material that has an etching selectivity with respect to the second gate electrode 154, the second gate insulation layer 150, the second field isolation layer pattern 143, etc. For example, the gate spacer 156 may include oxynitride such as silicon oxynitride, or nitride like silicon nitride. Here, the gate spacer 156 may include a material substantially the same as or substantially similar to that of the gate mask 152. Alternatively, the gate spacer 156 may include a material different from that of the gate mask 152.

The third and the fourth impurity regions 158 and 160 may include impurities substantially the same as or substantially similar to those of the first and the second impurity regions 134 and 148. However, the third and the fourth impurity regions 158 and 160 may have conductivity types different from those of the first and the second impurity regions 134 and 148 in accordance with conductivity types of the first and the second transistors.

An insulating interlayer 162 disposed on the first gate electrode 146 and the second field isolation layer pattern 143 to cover the first transistor and the second transistor. The insulating interlayer 162 may include an oxide such, for example, as silicon oxide. For example, the insulating interlayer 162 may include USG, SOG, FOX, FSG, PSG, BPSG, TEOS, PE-TEOS, HDP-CVD oxide, etc. In example embodiments, the insulating interlayer 162 may include an oxide substantially the same as or substantially similar to that of the first field isolation layer pattern 140 and/or that of the second field isolation layer pattern 143. Alternatively, the insulating interlayer 162 may include an oxide different from that of the first field isolation layer pattern 140 and/or that of the second field isolation layer pattern 143. In some example embodiment, the insulating interlayer 162 may have a flat surface through a planarization process.

A plurality of contacts is provided through the insulating interlayer 162 and/or the first field isolation layer pattern 140. Each of the contacts may include, for example, a metal and/or a metal compound. For example, the contacts may include tungsten, tungsten nitride, titanium, titanium nitride, aluminum, aluminum nitride, titanium aluminum nitride, tantalum, tantalum nitride, etc. These may be used alone or in a mixture thereof.

In example embodiments, a first contact 168 is formed through the insulating interlayer 162 to be electrically connected to the first gate electrode 146. That is, the first contact 168 may make contact with the first gate electrode 146 through the insulating interlayer 162.

A second contact 172 is formed through the insulating interlayer 162 and the first field isolation layer pattern 140. The second contact 172 may make contact with the first impurity region 134 and the first wiring 136. Thus, the first impurity region 134 may be electrically connected to the first wiring 136 serving as the bit line of the semiconductor device.

Third contacts 170 are located on the third and the fourth impurity regions 158 and 160 through the insulating interlayer 162. Each of the third contacts 170 may be electrically connected to the third and the fourth impurity regions 158 and 160 serving the source/drain regions of the second transistor.

As for the semiconductor device including the first transistor having the channel region vertically formed relative to the substrate 100 and the second transistor having the channel region horizontally relative to the substrate 100, the first wiring 136 serving as the bit line in the cell area may be electrically connected to the first impurity region 134 through the second contact 172. Thus, the semiconductor device includes the bit line having a resistance significantly smaller that that of the conventional semiconductor device having a vertical type transistor. Further, the first and the second field isolation layer patterns 140 and 143 may certainly isolate adjacent first and second active structures 126 and 132 in the cell and the peripheral circuit areas, so that a generation of p-n junction between the cell area and the logic area may be effectively prevented by preventing impurities from moving between the cell and the logic areas. Therefore, the semiconductor may have significantly improved electrical characteristics.

FIGS. 3 to 17 are cross sectional views illustrating methods of manufacturing semiconductor devices including different transistors in accordance with example embodiments. In FIGS. 3 to 17, methods of manufacturing DRAM semiconductor devices including different transistors may be described, however, the inventive concept is not limited to the above but rather may be employed in other semiconductor devices including, for example, different type switching elements.

Figure 3:
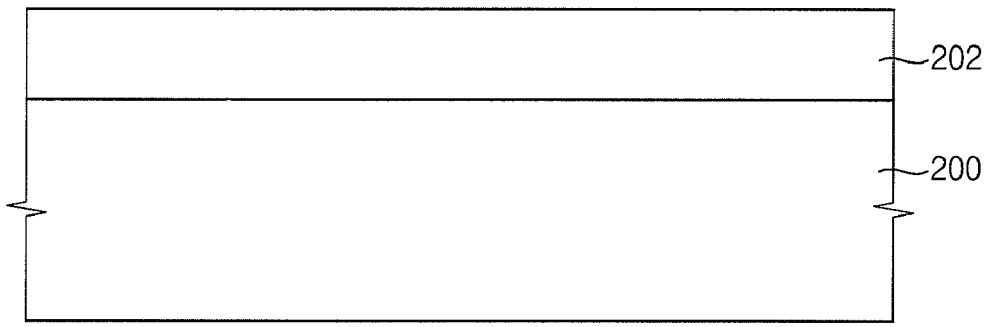
FIGS. 3 to 17 are cross sectional views illustrating methods of manufacturing semiconductor devices including different transistors in accordance with an example embodiment.

Referring to FIG. 3, an insulation layer 202 is formed on a substrate 200. The substrate 200 may include a semiconductor substrate such as, for example, a silicon substrate, a germanium substrate, a silicon-germanium substrate, etc. Alternatively, the substrate 200 may include a substrate having, for example, a semiconductor layer thereon. For example, the substrate 200 may include a silicon-on-insulator (SOI) substrate, a germanium-on-insulator (GOI) substrate, etc.

In example embodiments, the substrate 200 may include a first area and a second area. Memory cells of the semiconductor device may be formed in the first area of the substrate 200, and logic elements for controlling the memory cells may be provided in the second area of the substrate 200. For example, the first area and the second area may correspond to a cell area and a peripheral circuit area, respectively.

The insulation layer 202 may be formed using, for example, an oxide, oxynitride, nitride, etc. For example, the insulation layer 202 may be formed using silicon oxide, silicon nitride, silicon oxynitride, etc. The insulation layer 202 may be formed on the substrate 200 by, for example, a chemical vapor deposition (CVD) process, a thermal oxidation process, a plasma enhanced chemical vapor deposition (PECVD) process, an HDP-CVD process, etc. The insulation layer 202 may cover the whole surface of the substrate 200 and may have a thickness relatively smaller than that of the substrate 100.

Figure 4:
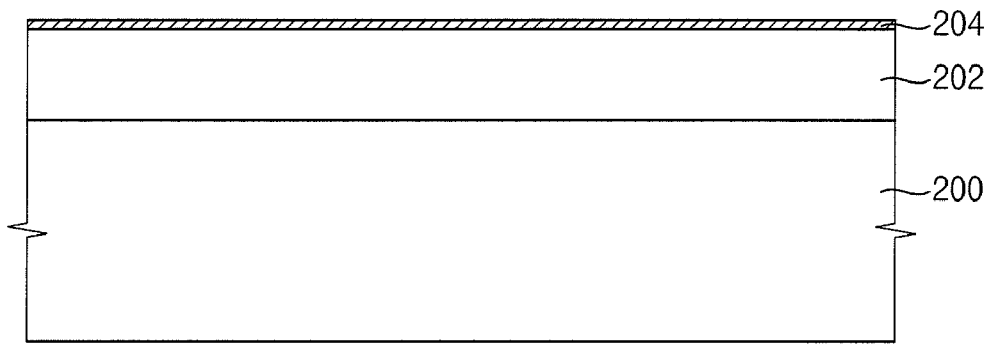

Referring to FIG. 4, a first conductive layer 204 is formed on the insulation layer 202. The first conductive layer 204 may be formed using, for example, a metal and/or a metal compound that has a relatively high melting point so as to prevent electrical characteristics thereof in subsequent processes. For example, the first conductive layer 204 may be formed using titanium, titanium nitride, tantalum, tantalum nitride, etc. These may be used alone or in a mixture thereof.

The first conductive layer 204 may be formed on the insulation layer 202 by, for example, a sputtering process, a CVD process, an atomic layer deposition (ALD) process, a vacuum evaporation process, a pulsed lased deposition (PLD) process, etc. The first conductive layer 204 may be also provided over the whole surface of the substrate 200. That is, the first conductive layer 204 may cover the first and the second areas of the substrate 200.

Figure 5:
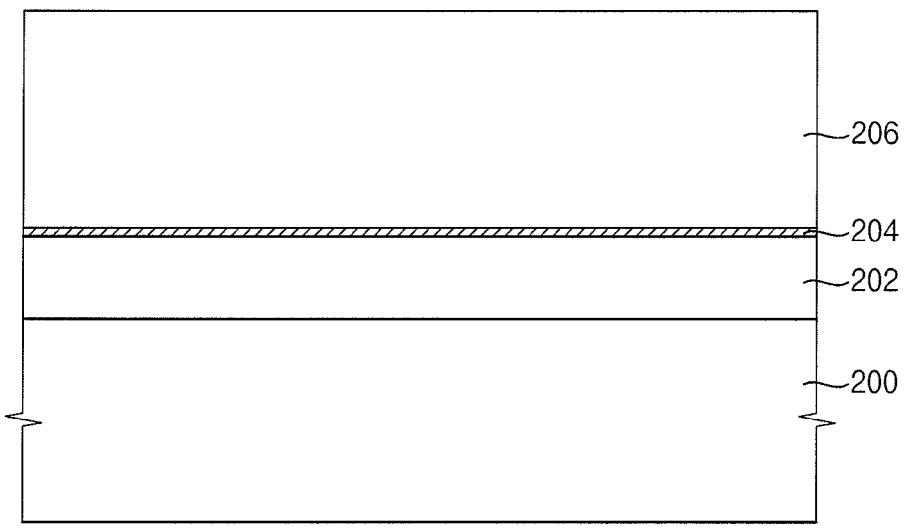

Referring to FIG. 5, a semiconductor layer 206 is formed on the first conductive layer 204. The semiconductor layer 206 may include a material substantially the same as or substantially similar to that in the substrate 200. For example, the semiconductor layer 206 may be formed using silicon, germanium, silicon-germanium, etc.

In some example embodiments, an adhesion layer may be formed between the first conductive layer 204 and the semiconductor layer 206. The adhesion layer may improve the adhesion strength between the first conductive layer 204 and the semiconductor layer 206.

The semiconductor layer 206 may have a sufficient thickness considering constructions of transistors in the semiconductor device. Namely, the semiconductor layer 206 may have a relatively large thickness because the transistors have constructions obtained through a plurality of etching processes.

Figure 6:
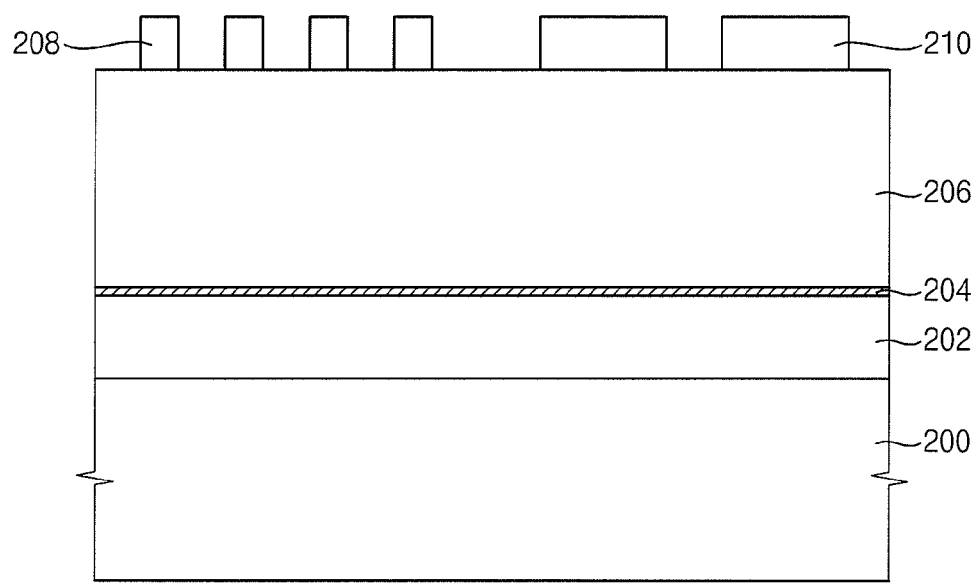

Referring to FIG. 6, a first mask 208 is formed on a first portion of the semiconductor layer 206 positioned in the first area of the substrate 200. Additionally, a second mask 210 is formed on a second portion of the semiconductor layer 206 located in the second area of the substrate 200. When a plurality of first transistors and second transistors are formed in the first and the second areas of the substrate 200, respectively, a plurality of first masks 208 and a plurality of second masks 210 may be provided on the semiconductor layer 206.

Each of the first and the second masks 208 and 210 may include a material having an etching selectivity with respect to the semiconductor layer 206 and the first conductive layer 204. In example embodiments, the first and the second masks 208 and 210 may be simultaneously obtained by one photolithography process. Further, the first and the second masks 208 and 210 may be formed using, for example, an oxide, a nitride, an oxynitride, etc. For example, the first and the second masks 208 and 210 may be formed using silicon oxide, silicon nitride, silicon oxynitride, etc.

In example embodiments, the first mask 208 may have, for example, a circular pillar shape, a polygonal pillar shape, an elliptical pillar shapes, etc. Further, a cross section of the first mask 208 may have, for example, a circular shape, a polygonal shape, an elliptical shape, etc. Meanwhile, the second mask 210 may have, for example, a bar shape or a line shape. The second mask 210 may extend on the semiconductor layer 206 along a first direction.

Figure 7:
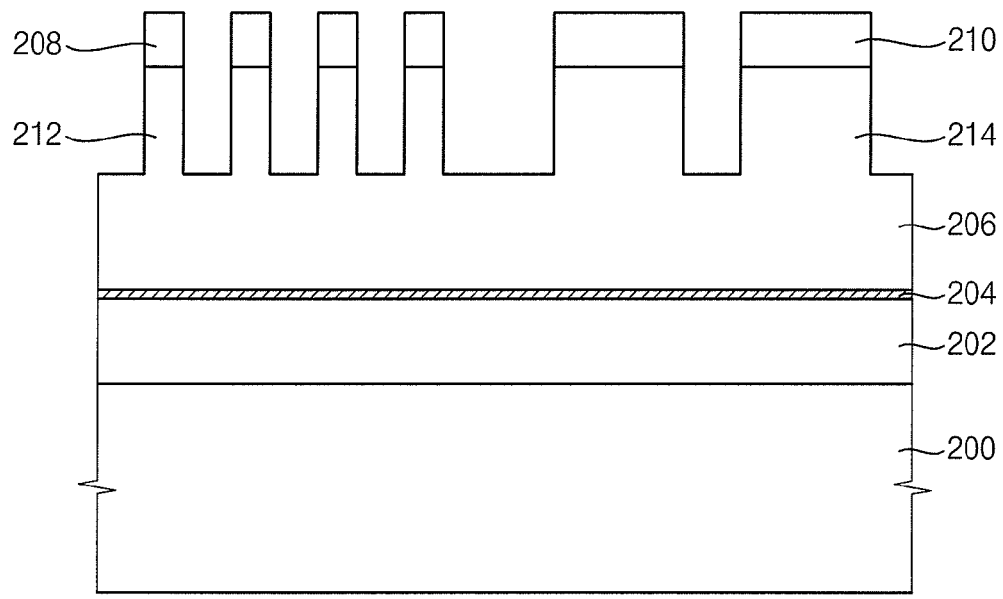

Referring to FIG. 7, the first portion of the semiconductor layer 206 may be partially etched using the first mask 208 as an etching mask, so that a first upper portion 212 is formed in the first area of the substrate 200. Additionally, the second portion of the semiconductor layer 206 is also partially etched using the second mask 210 as an etching mask to thereby form a second upper portion 214 in the second area of the substrate 200. In example embodiments, the first upper portion 212 and the second upper portion 214 may be simultaneously formed by one etching process. For example, the first and the second upper portions 212 and 214 may be formed by an anisotropic etching process.

In example embodiments, the first upper portion 212 may have a structure caused from the first mask 208. For example, the first upper portion 212 may have a circular pillar shape, a polygonal pillar shape, an elliptical pillar shape, etc. Further, the first upper portion 212 may have a cross section of, for example, a circular shape, a polygonal shape, an elliptical shape, etc. The second upper portion 214 may also have a structure in accordance with that of the second mask 210. For example, the second upper portion 214 may have a bar shape or a line shape. The second upper portion 214 may also extend along the first direction.

The second upper portion 214 may have a width substantially larger than a width of the first upper portion 212 when the second mask 210 has a width substantially larger than a width of the first mask 208. However, the first upper portion 212 may have a height substantially the same as or substantially similar to a height of the second upper portion 214.

Figure 8:
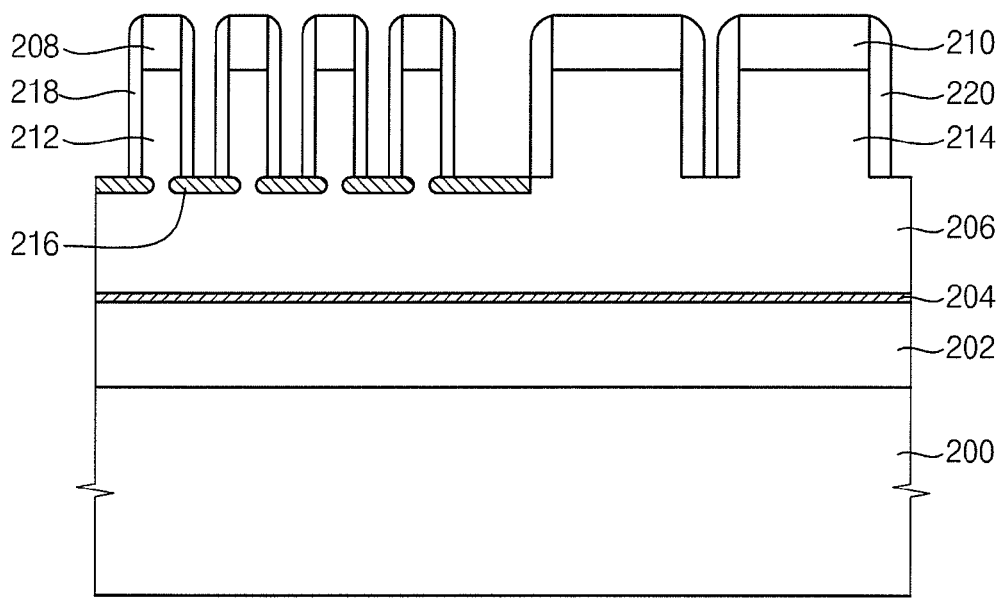

Referring to FIG. 8, first impurities are doped into a portion of the semiconductor layer 206 adjacent to the first upper portion 212 in the first area of the substrate 200. Hence, a preliminary first impurity region 216 is formed adjacent to the first upper portion 212. That is, the preliminary first impurity region 216 may be positioned at a portion of the semiconductor layer 206 exposed between adjacent first upper portions 212. While forming the preliminary first impurity region 216 in the first area of the substrate 200 by an ion implantation process, a mask may cover the second portion of the semiconductor layer 206 in the second area of the substrate 200.

The preliminary first impurity region 216 may include P type impurities or N type impurities in accordance with a conductivity type of the first transistor. For example, the preliminary first impurity region 216 may include the P type impurities such as boron (B), indium (In), etc. Alternatively, the preliminary first impurity region 216 may include the N type impurities, for example, phosphorus (P), arsenic (As), etc.

A third mask 218 is formed on sidewalls of the first upper portion 212 and the first mask 208, and a fourth mask 220 is formed on sidewalls of the second upper portion 214 and the second mask 210. Each of the third and the fourth masks may also include a material that has an etching selectivity relative to the semiconductor layer 206 and the first conductive layer 204. For example, the third and the fourth masks 218 and 220 may be formed using silicon nitride, silicon oxynitride, silicon oxide, etc.

In example embodiments, the third and the fourth masks 218 and 220 may enclose the sidewalls of the first and the second upper portions 212 and 214, respectively. Each of the third and the fourth masks 218 and 220 may have a spacer construction. Adjacent third masks 218 may be arranged in the first direction in the first area of the substrate 200.

Figure 9:
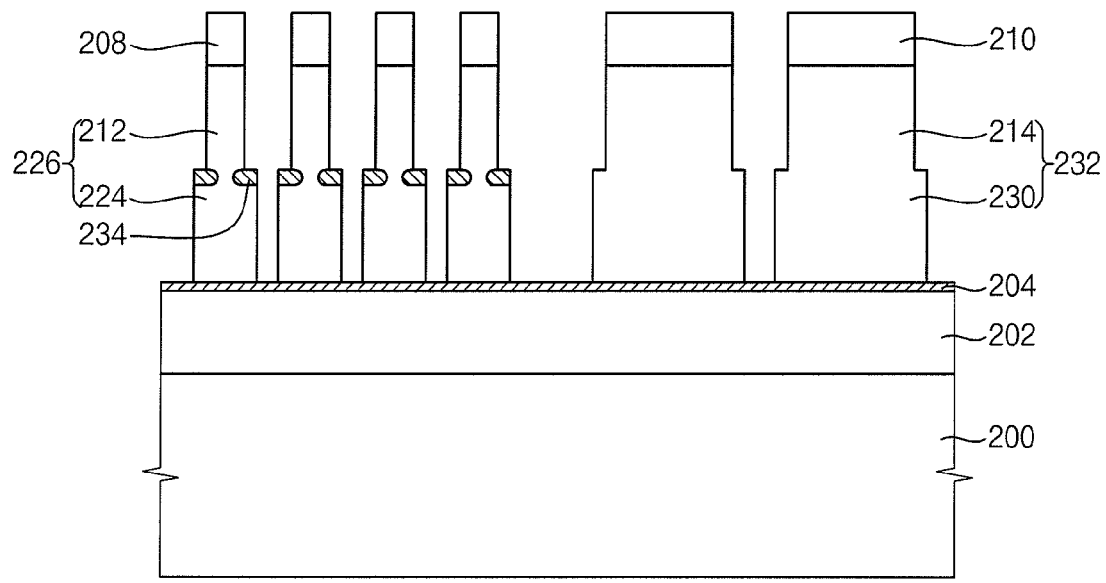

Referring to FIG. 9, the first and the second portions of the semiconductor layer 206 are partially etched using the third and the fourth masks 218 and 220 as etching masks. Namely, the first and the second lower portions 224 and 230 may be simultaneously formed by one etching process. Thus, a first lower portion 224 and a second lower portion 230 are respectively formed in the first area and the second area. The first lower portion 224 is positioned beneath the first upper portion 212, and the second lower portion 230 is located beneath the second upper portion 214. As a result, a first active structure 226 is formed in the first area, and a second active structure 232 is formed in the second area.

The first active structure 226 includes the first upper portion 212 and the first lower portion 224. The second active structure 232 has the second lower portion 230 and the second upper portion 214. In example embodiments, the first lower portion 224 and the second lower portion 230 may be integrally formed with the first upper portion 212 and the second upper portion 214, respectively.

When the plurality of the first transistors and the second transistors are provided in the first and the second area, a plurality of the first active structures 226 and a plurality of the second active structures 232 may be formed in the first and the second areas.

While forming the first and the second lower portions 224 and 230, the preliminary first impurity regions 216 is partially removed, such that a first impurity region 234 is formed at the first lower portion 224. The first impurity region 234 may serve as one of source/drain regions of the first transistor in the semiconductor device.

In example embodiments, the first lower portion 224 may have, for example, a bar shape or a line shape extending along the first direction. Further, the first lower portion 224 may have a width substantially larger than a width of the first upper portion 212. Hence, a step may be generated between the first lower portion 224 and the first upper portion 212. A width of the step may be substantially the same as or substantially similar to a width of the third mask 218. The first impurity region 234 may be positioned at an upper surface of the first lower portion 224. The second lower portion 230 may also have a width substantially larger than a width of the second upper portion 214, so that a step may be formed between the second lower portion 230 and the second upper portion. Such a step between the second lower and upper portions 230 and 124 may also have a width substantially the same as or substantially similar to a width of the fourth mask 220.

In some example embodiments, more than two first upper portions 212 may be formed on one first lower portion 224 when the first lower portion 224 has the bar shape or the line shape. Here, the first active structure 226 may include one first lower portion 224 and more than two first upper portions 212. The second lower portion 230 may also have, for example, a bar or a line shape. The second lower portion 230 may extend in the first direction.

After forming the first and the second active structures 226 and 230, the third and the fourth masks 218 and 220 are removed from the first and the second active structures 226 and 232. For example, the third and the fourth masks 218 and 220 may be etched using an etchant including fluoric acid or nitric acid. However, the first and the second masks 208 and 210 remains on the first and the second upper portions 212 and 214, respectively.

In example embodiments, the first upper portion 212 may have a first width substantially smaller than a second width of the first lower portion 224, and the second upper portion 214 may have a third width substantially smaller than a fourth width of the second lower portion 230. Additionally, the third width of the second upper portion 214 may be substantially larger than the first width of the first upper portion 212. Therefore, each of the first and the second active structures 226 and 232 may have a stepped construction.

Figure 10:
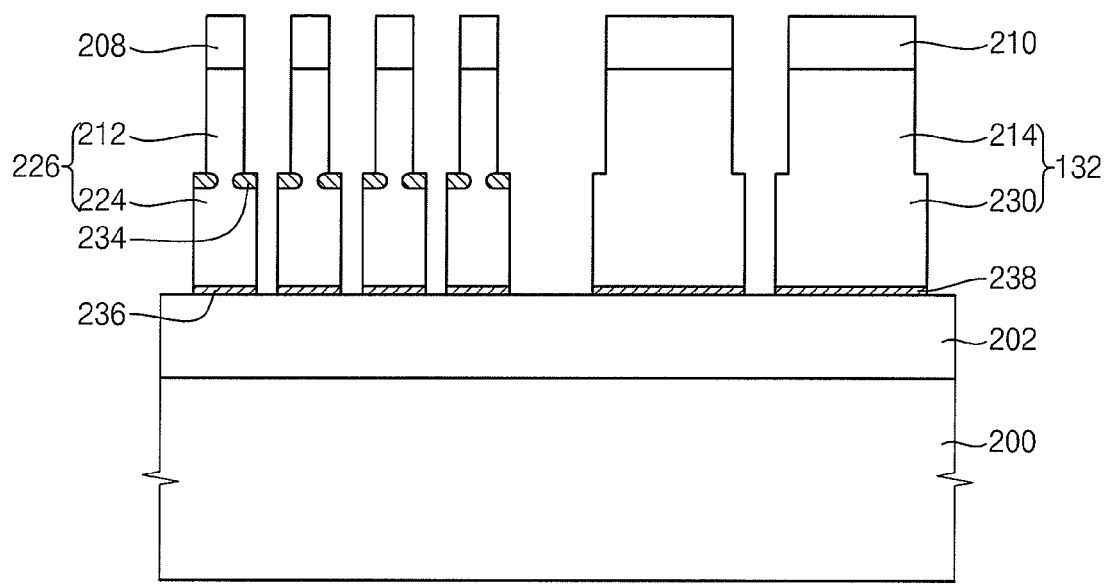

Referring to FIG. 10, the first conductive layer 204 is etched to form a first wiring 236 and a second wiring 238 on the insulation layer 202. The first and the second wiring 236 and 238 may be obtained, for example, using the first and the second active structures 226 and 230 as etching masks. The first wiring 236 is located beneath the first lower portion 224 of the first active structure 226, and the second wiring 238 is positioned beneath the second power portion 230 of the second active structure 232. Thus, the first wiring 236 is formed between the insulation layer 202 and the first active structure 226 in the first area of the substrate 200. Further, the second wiring 238 is provided between the insulation layer 202 and the second active structure 232 in the second area of the substrate 200. While forming the first and the second wirings 236 and 238, the first and the second mask 208 and 210 remains on the first and the second upper portions 212 and 214 to effectively protect the first and the second upper portions 212 and 214.

In example embodiments, the first wiring 236 may have a width substantially the same as or substantially similar to a width of the first lower portion 224. The first wiring 236 may extend along the first direction. Namely, the first wiring 236 and the first lower portion 224 may extend in the same direction. The second wiring 238 may also have a width substantially the same as or substantially similar to a width of the second lower portion 230. Further, the second wiring 238 may also extend along the first direction.

Figure 11:
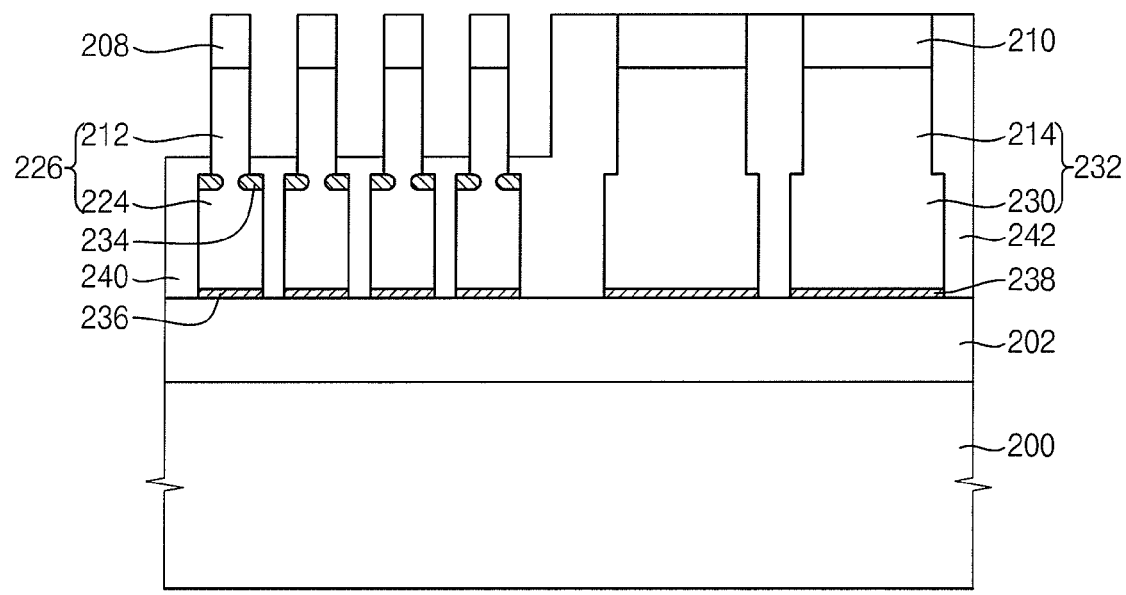

Referring to FIG. 11, a first field isolation layer pattern 240 is formed on the insulation layer 202 in the first area of the substrate 200, and a preliminary second field isolation layer pattern 242 is formed on the insulation layer 202 in the second area of the substrate 200. The first field isolation layer pattern 240 and the preliminary field isolation layer pattern 242 may be formed using, for example, an oxide such as silicon oxide. For example, each of the first field isolation layer pattern 240 and the preliminary second field isolation layer pattern 242 may be formed using USG, SOG, FOX, TOSZ, PSG, BPSG, TEOS, PE-TEOS, FSG, HDP-CVD oxide, etc.

The first field isolation layer pattern 240 may partially cover the first active structure 226. That is, the first active structure 226 may be partially buried in the first field isolation layer pattern 240. The first field isolation layer pattern 240 may fully cover the first lower portion 224 and may partially cover the first upper portion 212. Thus, the first upper portion 212 may be protruded from the first field isolation layer pattern 240. The first field isolation layer pattern 240 may have a height substantially larger than a height of the first lower portion 224. However, the height of the first field isolation layer pattern 240 may be substantially lower than the whole height of the first active structure 226. Adjacent first active structures 226 may be completely isolated from each other by the first field isolation layer pattern 240.

The preliminary second field isolation layer pattern 242 may fully cover the second active structure 232 in the second area. The preliminary second field isolation layer pattern 242 may have a height substantially the same as or substantially similar to the sum of the height of the second active structure 232 and the second mask 210. Thus, a surface of the second mask 210 may be exposed by the preliminary second field isolation layer pattern 242. Meanwhile, the height of the preliminary second field isolation layer pattern 242 may be substantially larger than the height of the first field isolation layer pattern 240.

In some example embodiments, the preliminary second field isolation layer pattern 242 may have a height substantially the same as or substantially similar to the height of the second active structure 232. Here, the second mask 210 may be protruded from the preliminary second field isolation layer pattern 242. Adjacent second active structures 232 may be certainly isolated from each other by the preliminary second field isolation layer pattern 242.

In forming the first field isolation layer pattern 240 and the preliminary second field isolation layer pattern 242, a field isolation layer may be formed on the insulation layer 202 to cover the resultant structures including the first and the second masks 208 and 210 on the insulation layer 202. The field isolation layer may be formed by, for example, a spin coating process, a CVD process, a PECVD process, an HDP-CVD process, etc. The field isolation layer may be partially removed until the first and the second masks 208 and 210 are exposed. Hence, a preliminary first field isolation layer pattern and the preliminary second field isolation layer pattern 242 are formed in the first area and the second area, respectively. Then, the preliminary first field isolation layer pattern is partially etched until the first upper portion 212 is exposed while covering the preliminary second field isolation layer pattern 242 with a mask. Therefore, the first field isolation layer pattern 242 is formed in the first area of the substrate 200.

Figure 12:
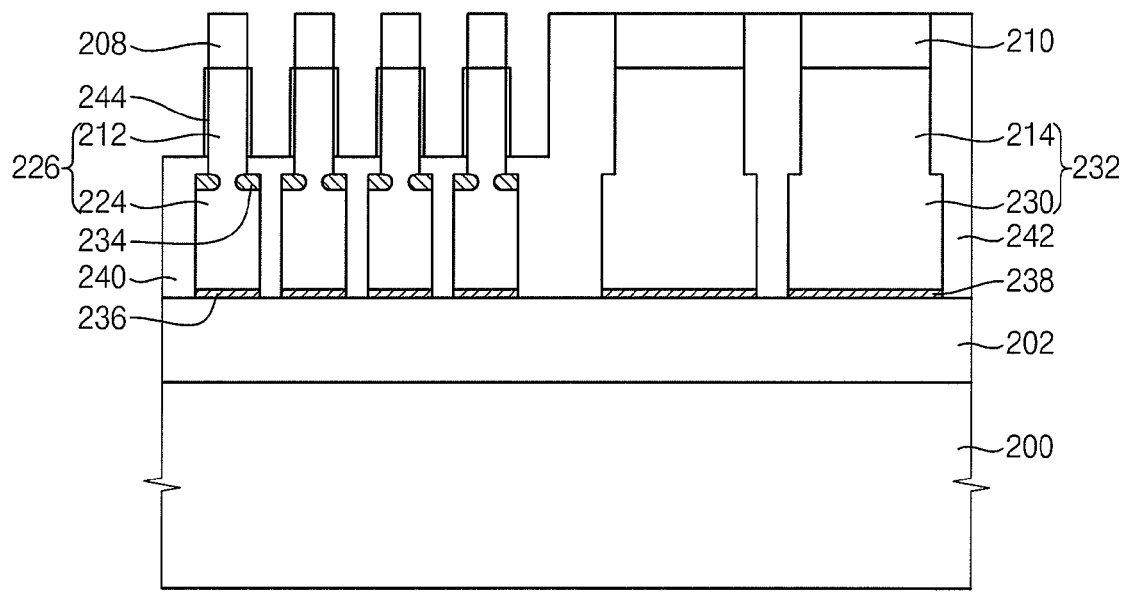

Referring to FIG. 12, a first gate insulation layer 244 is formed on a sidewall of the first upper portion 212 exposed by the first field isolation layer pattern 240. The first gate insulation layer 212 may electrically insulate the first upper portion 212 from a first gate electrode 246 (see FIG. 13). In example embodiments, the first gate insulation layer 244 may enclose the first upper portion 212. Further, the first gate insulation layer 244 may make contact with the first field isolation layer pattern 240 whereas the first gate insulation layer 244 may be spaced apart from the first impurity region 234 covered with the first field isolation layer pattern 240.

The first gate insulation layer 244 may be formed using, for example, an oxide or a metal compound. For example, the first gate insulation layer 244 may be formed using silicon oxide, aluminum oxide, hafnium oxide, titanium oxide, zirconium oxide, etc. These may be used alone or in a mixture thereof. Additionally, the first gate insulation layer 244 may be formed on the first upper portion 212 by, for example, a CVD process, an ALD process, a thermal oxidation process, a sputtering process, etc.

Figure 13:
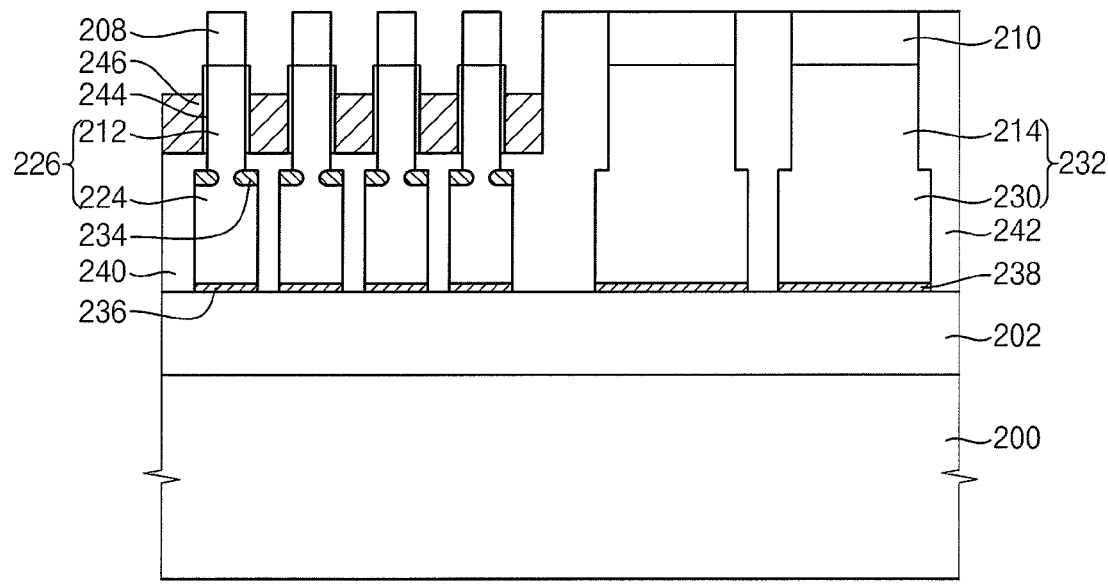

Referring to FIG. 13, a second conductive layer is formed on the first field isolation layer pattern 240. The second conductive layer may sufficiently cover the first active structure 226 in the first area. The second conductive layer may be formed using, for example, polysilicon, a metal and/or a metal compound. For example, the second conductive layer may include polysilicon doped with impurities, tungsten, titanium, tantalum, aluminum, aluminum nitride, tungsten nitride, titanium nitride, tantalum nitride, titanium aluminum nitride, tungsten silicide (WSix), titanium silicide, cobalt silicide, nickel silicide, etc. These may be used alone or in a mixture thereof. Further, the second conductive layer may be formed by, for example, a sputtering process, a CVD process, an ALD process, a PLD process, an evaporation process, etc.

A fifth mask is provided on the second conductive layer, and the second conductive layer is partially etched to foam the first gate electrode 246 on the first field isolation layer pattern 240. The first gate electrode 246 may extend on the first field isolation layer pattern 240 along a second direction different from the first direction. The second direction may be substantially perpendicular to the first direction.

In example embodiments, the first gate electrode 246 may enclose the first upper portion 212 of the first active structure 226 by interposing the first gate insulation layer 244 therebetween. The first gate electrode 246 may have a height substantially smaller than a height of the first upper portion 212, so that the first upper portion 212 may be protruded from the first gate electrode 246. As the first field isolation layer pattern 240 covers the first impurity region 234, the first gate electrode 246 may be spaced apart from the first impurity region 234.

Figure 14:
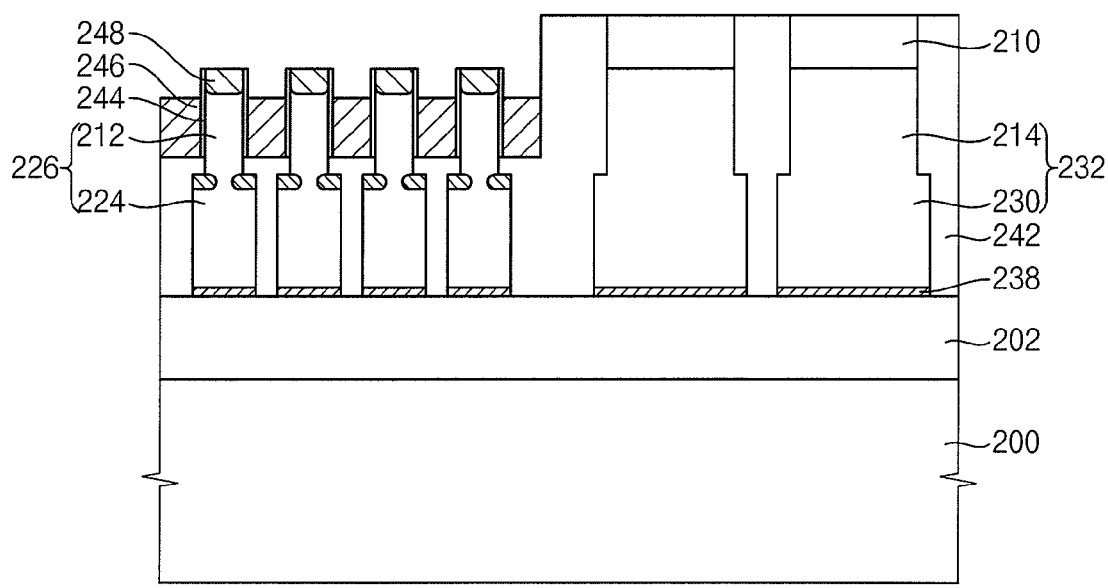

Referring to FIG. 14, the first mask 208 is removed from the first upper portion 212 of the first active structure 226, such that the first upper portion 212 is exposed. However, the second mask 210 may remain on the second upper portion 214 of the second active structure 232.

Second impurities are implanted into the exposed first upper portion 212 of the first active structure 226 to form second impurity region 248 at the first upper portion 212. The second impurity region 248 may serve as the other of the source/drain regions of the first transistor. The second impurities may also include P type impurities or N type impurities in accordance with the conductivity type of the first transistor. Here, the second impurity region 248 may include impurities substantially the same as or substantially similar to those in the first impurity region 234.

After forming the second impurity region 248, the first transistor is provided in the first area of the substrate 100. The first transistor includes the first active structure 212, the first impurity region 234, the first gate insulation layer 244, the first gate electrode 246 and the second impurity region 248. As the first and the second impurity regions 234 and 248 are formed at the first lower portion 224 and the first upper portion 212, a channel region of the first transistor may be generated between the first and the second impurity regions 234 and 248 along a direction substantially perpendicular to the substrate 200. That is, the first transistor may have the channel region vertically formed relative to the substrate 200.

Figure 15:
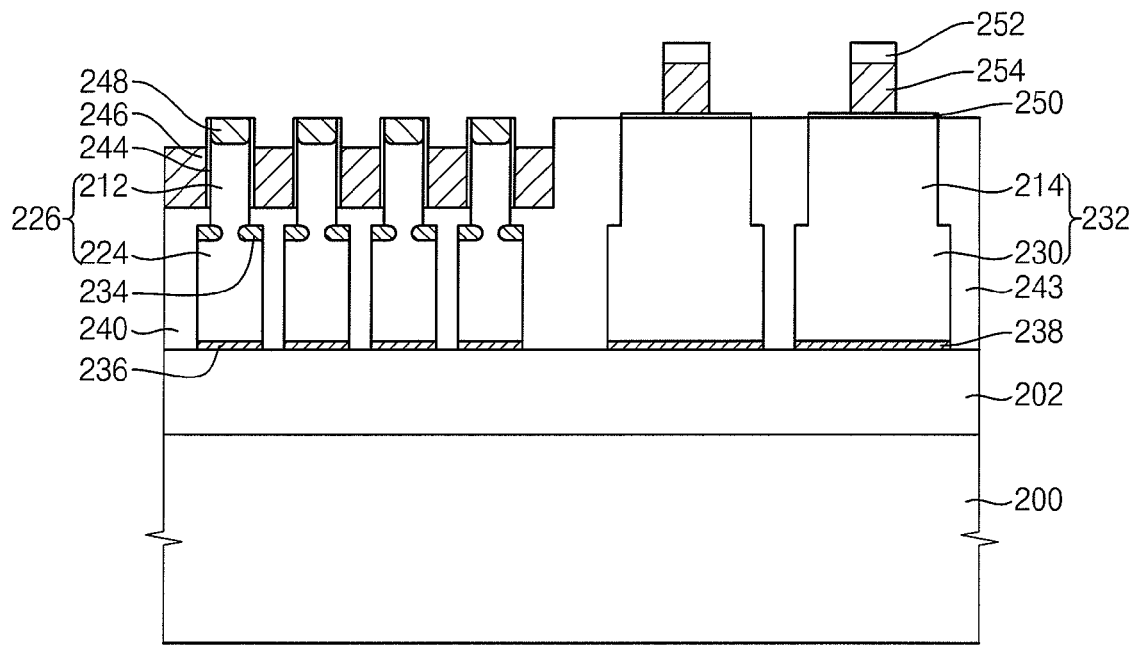

Referring to FIG. 15, a second field isolation layer pattern 243 is formed from the preliminary second field isolation layer pattern 242 after removing the second mask 210 from the second upper portion 214 of the second active structure 232. The second field isolation layer pattern 243 may be obtained by, for example, partially removing the preliminary second field isolation layer pattern 242 until the second upper portion 214 is exposed. Hence, the second field isolation layer pattern 243 may have a height substantially the same as or substantially similar to a height of the second active structure 232. After forming the second field isolation layer pattern 243, a surface of the second upper portion 214 of the second active structure 232 is exposed.

A second gate insulation layer 250 is formed on the exposed second upper portion 214. The second gate insulation layer 250 may be formed using, for example, an oxide or a metal compound. For example, the second gate insulation layer 250 may include silicon oxide, hafnium oxide, titanium oxide, aluminum oxide, zirconium oxide, etc. These may be used alone or in a mixture thereof. The second gate insulation layer 250 may be provided on the second upper portion 214 by, for example, a sputtering process, a CVD process, an ALD process, a thermal oxidation process, an evaporation process, etc. In example embodiments, the second gate insulation layer 250 may be formed using a material substantially the same as or substantially similar to a material of the first second gate insulation layer 244.

A third conductive layer is formed on the second gate insulation layer 250. The third conductive layer may be formed using, for example, polysilicon, a metal and/or a metal compound. For example, the third conductive layer may include polysilicon doped with impurities, tungsten, titanium, tantalum, aluminum, aluminum nitride, tungsten nitride, titanium nitride, tantalum nitride, titanium aluminum nitride, titanium silicide, cobalt silicide, nickel silicide, etc. These may be used alone or in a mixture thereof. Additionally, the third conductive layer may be formed by, for example, a sputtering process, a CVD process, an ALD process, a PLD process, an evaporation process, etc. In example embodiments, the third conductive layer may be formed using a material substantially the same as or substantially similar to a material of the second conductive layer.

After a gate mask 252 is formed on the third conductive layer, the third conductive layer is patterned to form a second gate electrode 254 on the second gate insulation layer 250. The second gate electrode 254 may extend on the second gate insulation layer 250 along the first direction. The second gate mask 252 may be formed using a material having an etching selectivity relative to the second field isolation layer pattern 243, the second active structure 232 and the second gate insulation layer 250. The gate mask 252 may be formed using a nitride or an oxynitride, for example, silicon nitride or silicon oxynitride.

Figure 16:
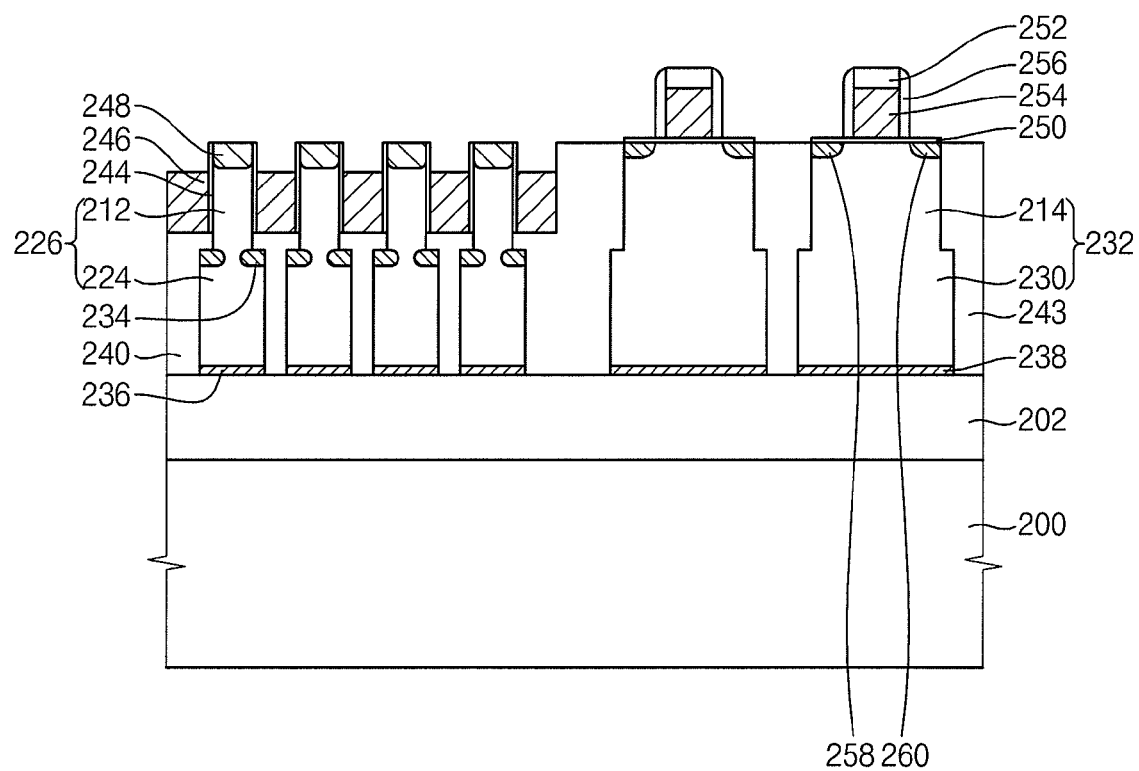

Referring to FIG. 16, a gate spacer 256 is formed on sidewalls of the gate mask 252 and the second gate electrode 254. The gate spacer 256 may be formed using, for example, a nitride or an oxynitride. For example, the gate spacer 256 may include silicon nitride or silicon oxynitride. In some example embodiments, the gate spacer 256 may be omitted to simplify the manufacturing processes of the semiconductor device.

Using the gate spacer 256 and the gate mask 252 as implantation masks, third impurities may be implanted into a portion of the second upper portion 214 adjacent to the second gate electrode 254. Hence, a third impurity region 258 and a fourth impurity region 260 are provided at the portions of the second active structure 232 adjacent to the second gate electrode 254. The third impurities may have a P type conductivity or an N type conductivity in accordance with a conductivity type of the second transistor. The third and the fourth impurity regions 258 and 260 may serve as source/drain regions of the second transistor, respectively.

When the third and the fourth impurity regions 258 and 260 are foil red at the second upper portion 214, the second transistor is provided in the second area of the substrate 200. The second transistor includes the second gate insulation layer 250, the second gate electrode 254, the gate mask 252, the gate spacer 256, the third impurity region 258 and the fourth impurity region 260. Because a channel region of the second transistor may be formed between the third and the fourth impurity regions 258 and 260 along a direction substantially parallel relative to the substrate 200, the second transistor may include the channel region generated horizontally with respect to the substrate 200.

In some example embodiments, a well may be formed in the second active structure 232 before forming the second transistor in the second area. Here, the second transistor may correspond to an NMOS transistor. When the well has a P type conductivity, the third and the fourth impurity regions 258 and 260 may include N type impurities. On the other hand, the third and the fourth impurity regions 258 and 260 may include P type impurities when the well has an N type conductivity. Here, the second transistor may be a PMOS transistor.

Figure 17:
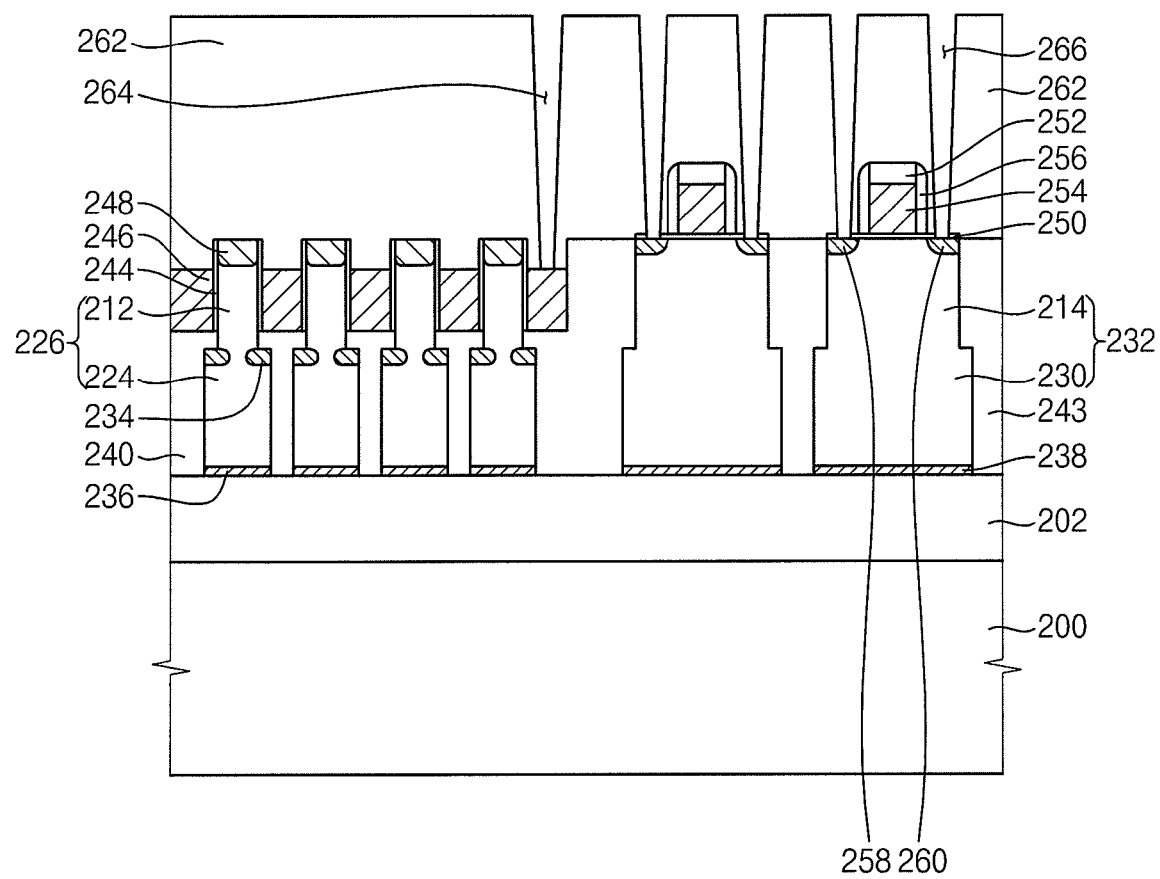

Referring to FIG. 17, an insulating interlayer 262 is formed on the first gate electrode 246 and the second active structure 232 to fully cover the first transistor and the second transistor. The insulating interlayer 262 may be formed using, for example, an oxide such as silicon oxide. For example, the insulating interlayer 262 may be formed using USG, SOG, FOX, TOSZ, TEOS, PE-TEOS, PSG, BPSG, FSG, HPD-CVD oxide, etc. Further, the insulating interlayer 262 may be formed by, for example, a CVD process, a spin coating process, a PECVD process, an HDP-CVD process, etc.

In example embodiments, the insulating interlayer 262 may include a material substantially the same as or substantially similar to a material of the first isolation layer pattern 240 and/or that of the second field isolation layer pattern 243. Alternatively, the insulating interlayer 262 may be formed using an oxide different from that of the first isolation layer pattern 240 and/or that of the second field isolation layer pattern 243.

In some example embodiments, the insulating interlayer 262 may be planarized by a planarization process to ensure a level surface of the insulating interlayer 262. For example, the insulating interlayer 262 may be planarized by a chemical mechanical polishing (CMP) process and/or an etch-bask process.

The insulating interlayer 262 is partially etched to form a first contact hole 264 and third contact holes 266 through the insulating interlayer 262. The first and the third contact holes 264 and 266 may be formed by, for example, an anisotropic etching process. The first contact hole 264 may partially expose the first gate electrode 246 in the first area, and the third contact holes 266 may expose the third and the fourth impurity regions 258 and 260 in the second area.

While forming the first and the third contact holes 264 and 266, the first isolation layer pattern 240 is also partially etched to form a second contact hole through the insulating interlayer 262, the first active structure 226 and the first isolation layer pattern 240 in the first area. The second contact hole may partially expose the first wiring 236. Here, the second contact hole may additionally expose the first impurity region 234.

A fourth conductive layer is formed on the insulating interlayer 262 to fully fill up the first contact hole 264, the second contact hole and the third contact holes 266. The fourth conductive layer may be formed using, for example, a metal and/or a metal compound. For example, the fourth conductive layer may include tungsten, aluminum, titanium, tantalum, tungsten nitride, aluminum nitride, titanium nitride, titanium aluminum nitride, tantalum nitride, etc. These may be used alone of in a mixture thereof. Additionally, the fourth conductive layer may be formed by, for example, a CVD process, a sputtering process, an ALD process, a PLD process, an evaporation process, etc.

The fourth conductive layer is partially removed until the insulating interlayer 262 is exposed, so that a first contact, a second contact and third contacts in the first contact hole 264, the second contact hole and the third contact holes 266, as illustrated in FIGS. 1 and 2. The first contact may be electrically connected to the first gate electrode 246, and the third contacts may be electrically connected to the third and the fourth impurity regions 258 and 260. The second contact may be electrically connected to the first impurity region 234 and the first wiring 236.

In example embodiments, the first impurity regions 234 and the first wiring 236 are electrically connected by the second contact, the semiconductor device may have a significantly reduced resistance when the first wiring 236 serves as a bit line of the semiconductor device. That is, the bit line of the semiconductor device may provide a resistance significantly lower than that of the conventional semiconductor device. Adjacent first and the second active structures 226 and 232 may be separated by the first and the second isolation layer patterns 240 and 243. Further, the insulation layer 202 is positioned beneath the first and the second active structures 240 and 243. Therefore, migration of impurities between the first area and the second area, which may cause a p-n junction of the semiconductor device, may be effectively prevented by the first isolation layer pattern 240, the second isolation layer pattern 243 and the insulation layer 202.

According to example embodiments, a first impurity region of a first transistor may be electrically connected to a first wiring serving as a bit line in a semiconductor device that includes the first transistor having a channel region formed in a direction substantially perpendicular to a substrate. Hence, the bit line may have considerably reduced resistance in a cell area of the semiconductor device in comparison with that of the conventional semiconductor device. Further, adjacent first and second active structures may be certainly separated by a first isolation layer pattern and a second field isolation layer pattern, such that a p-n junction between a cell area and a logic area of the semiconductor device may be effectively prevented. Therefore, the semiconductor device in accordance with example embodiments may provide enhanced electrical characteristics. When the semiconductor device of example embodiments are employed in various electric and electronic apparatuses, these apparatuses may have improved characteristics while reducing noises thereof.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
    forming an insulation layer on a substrate having a first area and a second area;
    forming a conductive layer on the insulation layer;
    forming a semiconductor layer on the conductive layer;
    forming a first active structure on the conductive layer in the first area by etching the semiconductor layer, the first active structure including a first lower portion extending in a first direction and a first upper portion protruding from the first lower portion;
    forming a first wiring beneath the first active structure by etching the conductive layer, the first wiring extending in the first direction;
    forming a first gate insulation layer enclosing the first upper portion;
    forming a first impurity region extending in the first direction at the first lower portion, the first impurity region being electrically connected to the first wiring; and
    forming a second impurity region at the first upper portion.

2. The method of claim 1, wherein the forming of the first active structure comprises:
    forming a first mask on the semiconductor layer in the first area;
    forming the first upper portion by partially etching the semiconductor layer using the first mask;
    forming a second mask on a sidewall of the first upper portion, the second mask extending in the first direction; and
    forming the first lower portion by partially etching the semiconductor layer using the second mask.

3. The method of claim 2, wherein the first wiring is formed by etching the conductive layer using the second mask as an etching mask.

4. The method of claim 2, further comprising:
    removing the second mask; and
    forming a first field isolation layer pattern on the insulation layer in the first area, the first field isolation layer pattern covering the first active structure and having a height larger than a height of the first lower portion.

5. The method of claim 4, further comprising:
    forming an insulating interlayer covering the first gate electrode, the first active structure and the first field isolation layer pattern;
    forming a first contact electrically connected to the first gate electrode through the insulating interlayer; and
    forming a second contact electrically connected to the first impurity region and the first wiring through the insulating interlayer and the first field isolation layer pattern.

6. The method of claim 1, further comprising forming a preliminary first impurity region at the semiconductor layer adjacent to the first upper portion after forming the first upper portion.

7. The method of claim 6, wherein the first impurity region is formed by partially etching the preliminary first impurity region while forming the first lower portion.

8. The method of claim 1, further comprising:
    forming a second active structure on the conductive layer in the second area by etching the semiconductor layer; and
    forming a second wiring beneath the second active structure by partially etching the conductive layer.

9. The method of claim 8, wherein the forming of the second active structure comprises:
    forming a third mask on the semiconductor layer in the second area;
    forming a second upper portion by etching the semiconductor layer using the third mask, the second upper portion extending in the first direction;
    forming a fourth mask on a sidewall of the second upper portion; and
    forming a second lower portion by partially etching the semiconductor layer using the fourth mask, the second lower portion extending in the first direction.

10. The method of claim 9, further comprising forming a second field isolation layer pattern in the second area to cover the second active structure and to expose the second upper portion.

11. The method of claim 10, further comprising:
    forming a second gate insulation layer on the second upper portion;
    forming a second gate electrode on the second gate insulation layer; and
    forming a third impurity region and a fourth impurity region at the second upper portion adjacent to the second gate electrode.

* * * * *